United States Patent
Amaratunga et al.

(10) Patent No.: US 7,355,226 B2
(45) Date of Patent: Apr. 8, 2008

(54) POWER SEMICONDUCTOR AND METHOD OF FABRICATION

(75) Inventors: Gehan Anil Joseph Amaratunga, Cambridge (GB); Florin Udrea, Cambridge (GB)

(73) Assignee: Cambridge Semiconductor Limited, Cambridge (GB)

( * ) Notice: Subject to any disclaimer, the term of this patent is extended or adjusted under 35 U.S.C. 154(b) by 30 days.

(21) Appl. No.: 11/414,308

(22) Filed: May 1, 2006

(65) Prior Publication Data

US 2006/0197156 A1    Sep. 7, 2006

Related U.S. Application Data

(62) Division of application No. 10/936,721, filed on Sep. 9, 2004.

(30) Foreign Application Priority Data

Sep. 8, 2004   (GB)   ................... 0419919.6

(51) Int. Cl.
*H01L 29/786* (2006.01)
(52) U.S. Cl. .............. 257/288; 257/351; 257/400; 257/404; 257/405; 438/109; 438/455; 438/510
(58) Field of Classification Search ............. 257/351, 257/400, 404, 405, 288; 438/109, 455, 510
See application file for complete search history.

(56) References Cited

U.S. PATENT DOCUMENTS

| 5,382,818 | A | 1/1995 | Pein |
| 5,574,292 | A | 11/1996 | Takahashi et al. |
| 5,766,984 | A * | 6/1998 | Ramm et al. ............... 438/109 |
| 5,977,569 | A | 11/1999 | Li |
| 6,063,686 | A * | 5/2000 | Masuda et al. ............ 438/406 |
| 6,221,737 | B1 | 4/2001 | Letavic et al. |
| 6,307,232 | B1 | 10/2001 | Akiyama et al. |
| 6,310,378 | B1 | 10/2001 | Letavic et al. |
| 6,703,684 | B2 * | 3/2004 | Udrea et al. ............... 257/548 |
| 2004/0018699 | A1 * | 1/2004 | Boyd et al. ............... 438/455 |
| 2004/0087065 | A1 * | 5/2004 | Udrea et al. ............... 438/140 |
| 2005/0184343 | A1 * | 8/2005 | Thornton et al. ........... 257/351 |

* cited by examiner

*Primary Examiner*—Michael G. Lee
*Assistant Examiner*—Allyson N Trail
(74) *Attorney, Agent, or Firm*—Fisher Technology Law PLLC (57) ABSTRACT

This invention is generally concerned with power semiconductors such as power MOS transistors, insulated gate by bipolar transistors (IGBTs), high voltage diodes and the like, and method for their fabrication. A power semiconductor, the semiconductor comprising a power device, said power device having first and second electrical contact regions and a drift region extending therebetween; and a semiconductor substrate mounting said device; and wherein said power semiconductor includes an electrically insulating layer between said semiconductor substrate and said power device, said electrically insulating layer having a thickness of at least 5 μm.

12 Claims, 7 Drawing Sheets

POWER SEMICONDUCTOR AND METHOD OF FABRICATION

This application is a divisional of U.S. patent application Ser. No. 10/936,721 filed Sep. 9, 2004, incorporated herein in its entirety.

This invention is generally concerned with power semiconductors such as power MOS transistors, insulated gate bipolar transistors (IGBTs), high voltage diodes and the like, and methods for their fabrication.

In this specification we are particularly concerned with power semiconductor devices which, as described further below, generally incorporate a drift region or layer between two or more electrical contacts, the purpose of which is to withstand relatively high voltages when the device is in an off-state. When we refer to power devices we are generally referring to high voltage devices which typically operate with a voltage in the range 100 volts to 1.2 kilovolts (or higher) and at powers of greater than 1 Watt. There are many types of power semiconductor including diodes, transistors, thyristors, double gate devices and the like. Power semiconductors may be incorporated into discrete devices, into hybrid circuits, and into power integrated circuits, in the latter case often alongside low voltage devices performing a driver or control function. Applications of such devices include motor control and power supplies for a wide range of equipment.

For devices designed for use in integrated circuits, it is preferred that the main terminals (variously called the anode/cathode, drain/source and emitter/collector) and the control terminals (termed the gate or base) are placed at the surface of the device in order to be easily accessible. The main current flow is between the main terminals ad is therefore principally lateral. Such devices are therefore typically referred to as lateral devices. Such devices are often integrated with low-voltage devices or circuits built in CMOS-type or other standard planar technologies to form power integrated circuits. Several high voltage/power devices may be integrated in the same chip. Isolation is provided between the high-power and the low-power devices as well as between adjacent power devices. Two principal isolation technologies have emerged, namely junction-isolation (JI) technology and semiconductor (silicon)-on-insulator (SOD) technology.

In JI technology, a reverse-biased junction is used to isolate adjacent devices. However, this is in many cases not satisfactory for power integrated circuits since minority carrier conduction through the semiconductor substrate (on which the active part of the device is formed) can take place and interference between adjacent devices is therefore difficult to prevent. In addition, JI bipolar devices (such as the lateral IGBT) also suffer from parasitic mobile carrier plasma stored in the semiconductor substrate in the on-state which has to be removed during turn-off. This decreases dramatically the switching speed of the devices.

In SOI technology, a buried insulating layer (oxide), BOX is used to isolate vertically the top semiconductor layer from the bottom semiconductor layer and, accordingly, current conduction is principally restricted to the top semiconductor layer and there is practically no current in the bottom semiconductor layer in any static mode of operation. Horizontal or lateral isolation in SOI is typically provided via trenches which are filled with oxide or by use of the known LOCOS ("local oxidation of silicon") isolation. SOI technology offers better isolation than JI technology because the buried insulating layer prevents current conduction and plasma formation in the substrate, and faster switching because of reduced parasitic capacitance.

High voltage semiconductor devices have incorporated within the body of the device a high voltage junction that is responsible for blocking the voltage. This junction includes a relatively lowly doped semiconductor layer which withstands the largest portion of the voltage across the main terminals when the device is in the off-state and operating in the voltage blocking mode. This layer is commonly referred to as the drift region or layer and is partially or fully depleted of mobile charge carriers during this operating mode. Ideally, the potential is equally distributed along the drift region between the two ends of the drift region. However, as shown by the 1-D Poisson equation, for a given doping of the drift region, distribution of the electric field has a triangular shape or, when fully depleted, a trapezoidal shape. Since the area underneath the electric field can be approximated as the breakdown voltage when the peak of the electric field reaches the critical electric field in the semi-conductor, it is obvious that for a 1-D junction, the lower the doping of the drift layer, the higher the breakdown voltage. However, for majority carrier devices such as MOSFET types, known as LD (lateral double diffused) MOSFETs, the on-state resistance of the drift layer is inversely proportional to the doping of the drift layer. Since a low on-resistance is desired for a high voltage switch, it follows that a low doping concentration affects the on-state performance of the device. In addition for lateral devices, the critical electric field at the surface is smaller than in the bulk, adding further difficulties in designing high voltage lateral devices.

Figure 1A:
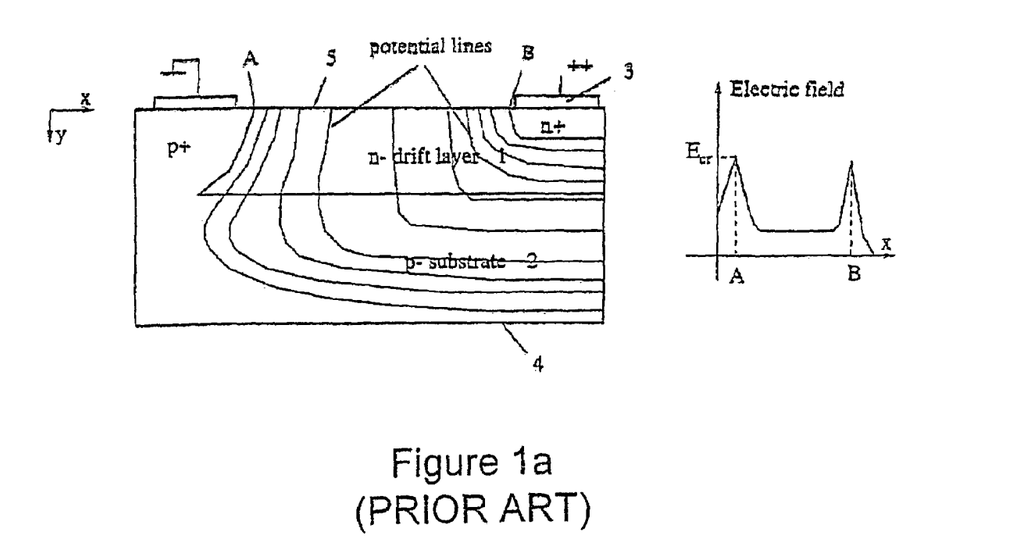
FIGS. 1a and 1b show schematic cross-sectional views of a junction and SOI power device respectively, as known in the art.

The introduction of the RESURF (Reduced Surface Field Effect) technique for JI devices allows an increase in the breakdown voltage of lateral devices through the use of an additional vertical junction formed between the drift region and the semiconductor substrate. FIG. 1a shows schematically a conventional JI diode using the RESURF effect. This diode is provided as part of a conventional lateral power device such as a lateral transistor, LDMOSFET or LIGBT. FIG. 1a also shows the distribution of the potential lines and the edge of the depletion region during the voltage blocking anode. It can be noted that the drift layer 1 is fully depleted but the semiconductor substrate 2 is not fully depleted. The potential lines bend as they drop in the substrate, from the vertical direction towards the horizontal direction, such that below the high voltage terminal 3, the potential lines are practically parallel to the bottom surface 4 of the substrate 2. This is because the thickness of the semiconductor substrate 2 is relatively large (typically 300 μm) compared to the lateral extension of the depletion region on the top surface 5 of the drift region 1 from A to B (typically 60 μm for a 600V device). Hence, the semiconductor substrate 2 is not fully depleted when the breakdown of the device occurs. It is known that a lateral JI diode can achieve breakdown voltages equivalent to those of vertical diodes, in spite of the reduced surface critical electric field. Nevertheless, as shown in FIG. 1a, even an optimised electric field distribution using the RESURF concept is far from being ideal (i.e. rectangular in shape). In addition as already mentioned, the JI devices suffer from high leakage currents and very poor isolation, which makes integration within a power integrated circuit very difficult.

Figure 1B:
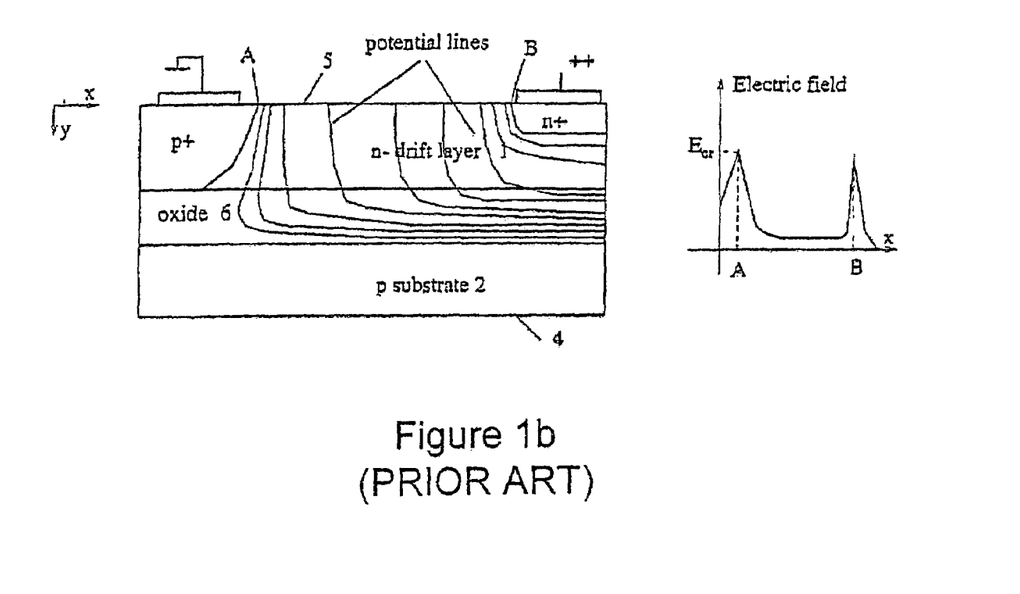

FIG. 1b shows a conventional SOT diode which is typically found as part of an SOI lateral high voltage power device. The structure can be made using the known wafer bonding, Unibond or SIMOX (separation by implantation of oxygen) SOI technologies. Other technologies such as Silicon-on-Diamond (SOD) and silicon-on-sapphire are also known. FIG. 1b also shows the equipotential line distribution during the voltage blocking mode. It can be seen that the potential lines crowd more towards the edges of the drift layer 1 at points A and B compared to the JI case in FIG. 1a, resulting in a poor RESURF effect. This is because due to a field effect action across the buried oxide an inversion/ accumulation layer forms directly beneath the buried oxide layer in the p (or n) type substrate and this layer of highly mobile charge maintains an equipotential surface at ground potential beneath the buried oxide screening nearly all of the electric field from the bulk of the substrate and behaving as a field plate.

Increasing the thickness of the buried oxide 6 helps to redistribute the potential lines more evenly at the top surface 5 but there is a limit to the BOX thickness using conventional fabrication techniques. In general, the breakdown voltage is still below that of a JI device or JI diode as shown in FIG. 1a. Again, the potential lines in the drift layer 1 and the buried silicon oxide insulating layer 6 below the high voltage terminal are practically aligned to the horizontal surface. This is due to the fact at the semiconductor substrate 2 is not depleted. The result is that all the potential lines have to crowd into the rift layer 1 and insulating layer 6 in the case of SOI and moreover have to align parallel to the insulating layer 6/semiconductor substrate 2 interface. This creates an uneven distribution of the potential lines at the top surface 5 which results in light electric field peaks and therefore lower breakdown voltages. In addition, for SOI devices, the conservation of the perpendicular component of the electric flux density $D=\epsilon E$ at the top of the semiconductor layer 1/buried oxide 6 interface limits the maximum voltage that the buried oxide 6 can sustain before the critical electric field in the semiconductor layer 1 at the interface is reached. This vertical breakdown yields a very strong limitation on the maximum voltage rating achievable for a given buried oxide thickness.

Thus, in summary, in both JI and SOI devices, the potential ices have to bend from a vertical orientation to a horizontal or lateral orientation and the potential distribution in the drift layer is far from ideal.

For discrete devices or hybrid circuits used in high voltage or power electronics, the main terminals may have a vertical orientation and may be placed, at opposite sides of the wafer (e.g. with the low voltage terminal at the top and the high voltage terminal at the bottom); in other configurations vertical devices may have electrodes on the same face of the wafer. These devices are referred to as vertical high voltage/power devices, Compared to lateral devices, the current flow between the main terminals is principally vertical and this can facilitate a larger current capability and a higher breakdown voltage. Such devices are however difficult to use in integrated circuits. Example of known high voltage/power devices are DMOS & Trench MOSFETs, DMOS & Trench IGBTs and superjunction MOS Or Cool MOS™.

For an optimised trade-off between on-state/switching/ breakdown performance, vertical devices prefer a narrow drift region that is fully depleted at full voltage blocking. Such a layer may have a thickness from 6 µm to 180 µm for devices rated from 50 V to 1.2 kV. Commonly the drift layer lies on a highly doped semiconductor substrate. The semiconductor substrate however introduces a series of negative effects on the general performance of the device. First, it introduces a parasitic resistance, which leads to increased on-state power losses. Secondly, for bipolar devices with anode injection such as IGBTs, since the doping of the substrate is high, to reduce the power losses in the substrate resistance, the injection from the substrate which acts as the anode (emitter) of the device is in most cases too strong, leading to high transient switching losses and slow turnoff due to the a large amount of plasma stored inside the drift region during on-state. Thirdly, the substrate introduces a thermal resistance which prevents effective dissipation of heat to an external sink placed at the bottom of the device. Finally, if vertical devices are to be used in integrated circuits, the presence of the thick semiconductor substrate can make isolation between adjacent devices difficult.

The present applicants have described a solution to the above problems in U.S. Pat. No. 6,703,684 and U.S. 2004/ 0087065, the contents of which are hereby incorporated by reference in their entirety. Broadly speaking this involves fabricating the semiconductor device, more specifically the drift region, in a membrane supported away from the underlying substrate. The applicants describe an alternative solution to the above problems in this application.

According to a first aspect of the present invention there is therefore provided a power semiconductor, the semiconductor comprising: a power device, said power device having first and second electrical contact regions and a drift region extending therebetween; and a semiconductor substrate mounting said device; and wherein said power semiconductor includes an electrically insulating layer between said semiconductor substrate and said power device, said electrically insulating layer having a thickness of at least 5 µm.

The first and second electrical contact regions typically comprise heavily doped semiconductor regions in contact with electrode metallisation (either metal or polysilicon); the drift region may have a direct or am indirect connection to the contact regions. The thickness of the electrically insulating or dielectric layer is at least 5 or 6 µm, but is preferably greater than 10 or 15 µm. Suitable fabrication techniques are described later but, broadly speaking, the power device is fabricated such that it is inverted as compared with conventional techniques. For example where the power device is fabricated on the surface of a semiconductor, in particular the top surface of an SOI substrate, this surface is arranged to face the semiconductor substrate of the above described aspect of the invention so that in effect the power device is upside down. The power device may comprise a lateral or a vertical device.

The applicant's aforementioned US patent, U.S. '684, describes in detail advantages of effectively moving the drip region away from the semiconductor substrate, but broadly speaking the main advantage is that the field lines, such as those shown in FIGS. 1a and 1b, are no longer crowded so that a much more uniform electric field is achievable in the drift region. A uniform electric field is desirable because this spreads the electric field to be sustained by the device equally across the device rather than having peaks in the electric field at certain points which reduce the overall breakdown voltage.

In U.S. '684 this is achieved by, in effect, lifting the power device off the substrate, fabricating it within a membrane, but the applicants have recognised that by inverting a conventional power device structure it is possible to provide a thick dielectric layer between the device and the semiconductor substrate with similar results. There is also the possibility of improved thermal conduction between the device and the substrate as compared with U.S. '684.

In embodiments the insulating layer comprises a series of metallisation layers, each a few microns thick, for example 3 to 7, or more such layers. These are typically 0.5-2 µm thick any may be separated by dielectric layers of a similar thickness. The dielectric layers may be formed of different materials such that the dielectric constant of the layers reduces away from the active region of the device, Optionally an additional final layer of dielectric, for example, low temperature oxide (LTO), may be provided over the metallisation layers. The final layer (and preferably also intermediate layers) may be planerised by CMP (chemical mechanical polishing) as the structure is formed.

In such an arrangement the insulating layer comprises mainly oxide but may include columns of metallisation to the contact regions. Alternatively the insulating layer may be formed of other materials, for example polyimide, silicon nitride, polycrystalline or nanocrystalline diamond, boron nitride, or aluminium oxide or nitride deposited, for example, by sputtering, CVD or the like. The semiconductor substrate may be wafer bonded to the insulating layer(s). As previously mentioned, optionally the surface of the semiconductor substrate to be wafer bonded may be oxidised to prevent direct contact with electrode metallisation, for example with an oxide thickness 0.5 to 3 µm or more.

From the foregoing discussion it will be understood that the power semiconductor will generally include contact metallisation for making electrical contact to the first and second electrical contact regions. Because, in embodiments, the device is effectively inverted with respect to the substrate as compared with a conventional structure at least a portion of this contact metallisation will be disposed between the power device and the substrate, more particularly within the insulating layer. Moreover, again because of the inverted device configuration, electrical contacts to the device will generally be made from what is effectively the back of a conventional device but what becomes the top (upper surface) of a device in embodiments of the present invention. Thus, for example, at least a portion of the contact metallisation may extend substantially completely vertically through the device from a surface of the device facing the substrate to a opposite or upper surface of the device.

As described further below the device is preferably fabricated starting from SOI structure, a wafer being bonded to the top of the structure and the arrangement then being turned upside down and etched to remove the base substrate of the SOI structure. The buried oxide may be used as an etch stop. Thus in embodiments the top of the power semiconductor is formed by what was formerly the buried oxide layer, although optionally a pasivation layer may be added over this. One or more holes for vias may be opened in this (formerly) buried oxide layer for making connections to contact layers which were above the active region of the device but which, after inversion, are below the active region.

It will be appreciated that in addition to the thick layer of dielectric below the device, in embodiments there is a thin layer of dielectric followed by air above the device so that the power device, and more particularly the drift regions has relatively low dielectric constant material to either side of it and is spaced well away torn any semiconductor (i.e. the substrate) which could act as a field plate.

In another aspect the invention provides a power semiconductor, the semiconductor comprising: a layer of silicon within which a power device is formed, said power device having electrical contact regions and a drift region therebetween, a silicon substrate; a first insulating layer between said layer of silicon including said power device and said semiconductor substrate; and wherein said power device is inverted such that said contact regions of said device face said substrate.

The invention further provides a power semiconductor, the semiconductor comprising: a layer of silicon within which a power device is formed; a silicon substrate; a first insulating layer between said layer of silicon including said power device and said semiconductor substrate; and a second insulating layer over said layer of silicon including said power device and on an opposite side of said power device to said first layer; and wherein said second insulating layer has substantially flat and parallel upper and lower surfaces.

It will be appreciated that where the power device is initially fabricated on a semiconductor-on-insulator substrate comprising buried oxide, when the device is inverted and etched the structure that remains has what was the buried oxide overlying the device as a substantially planar layer, with broadly flat top and bottom surfaces.

The invention also provides a lateral semiconductor-on-insulator device comprising: a semiconductor substrate; an insulating layer on said semiconductor substrate; and a lateral semiconductor device on said insulator; said lateral semiconductor device having: a first region of a first conductivity type; a second region of a second conductivity type laterally spaced apart from said first region; and a drift region extending in a lateral direction between said first region and said second region; and at least one electrode connection to one of said first and second regions made to a surface of said device towards said insulating layer.

The invention further provides A lateral semiconductor-on-insulator device comprising: a semiconductor substrate; an insulating layer on said semiconductor substrate; and a lateral semiconductor device on said insulator; said lateral semiconductor device having, a first region of a first conductivity type; a second region of a second conductivity type laterally spaced apart from said first region; and a drift region extending in a lateral direction between said first region and said second region; and at least one metallisation layer between said drift region and said substrate.

In a further aspect the invention provides a method of fabricating a power semiconductor, the method comprising: forming a semiconductor device on a semiconductor-on-insulator (SOT) substrate, said SOI substrate comprising a first substrate, an intermediate insulating layer and a semiconducting layer; forming one or more at least partially insulating layers over said semiconductor device; attaching a second substrate on top of said one or more at least partially insulating layers; and removing said first substrate.

In this way the device is inverted on the second substrate as compared to its (conventional) orientation on the first substrate. Preferably the one or more at least partially insulating layers have a thickness of greater than 5 µm. As previously mentioned, these will generally include metallisation for making contact to the device and may comprise layers of metallisation and/or oxide. Preferably the second substrate is attached by means of wafer bonding. In embodiments connections are made by coming through what was the back or underside of the device, in particular by etching through the intermediate insulating layer (which was exposed by removing the first substrate).

The above-described power semiconductors and fabrication methods may be employed for a range of high voltage power devices including, but not limited to, a high voltage diode, thyristor, LILET (lateral inversion layer emitter thyristor), SCR rectifier, LDMOSFET, Super Junction LDMOSFET, LIGBT (lateral IGBT), bipolar transistor, and JFET (junction FET) and, more generally, to both lateral and vertical devices. Thus in embodiments the power device may include a third electrical contact region and a control electrode, typically disposed over a body region of the device and over a portion of the drift region (but insulated from both). Where the power device comprises an LIGBT a fourth heavily doped or contact region may be present.

Features of the above describe aspects of the invention, for example oxide thickness insulating layer configuration and the like, may be combined in any permutation.

These and other aspects of the present invention will now be further described, by way of example only, with reference to the accompanying drawings in which;

FIG. 6a shows an LDMOS device at a fourth stage of fabrication according to the present invention and FIG. 6b shows a plan view of contact pad regions for the LDMOS device of FIG. 6a.

Figure 2A:
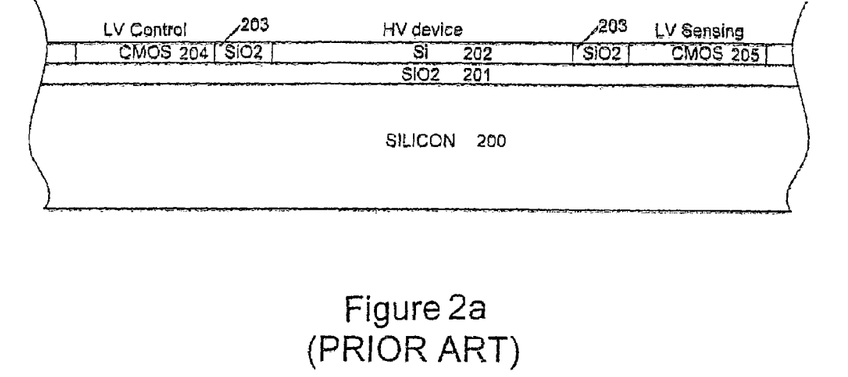
FIGS. 2a and 2b show prior art examples used for realising high voltage power integrated circuits in SOI technology.

In FIG. 2a the active Si layer is comprised of regions 202, 204 and 205 ascribed for a high voltage device, standard CMOS low voltage (LV) control and analogue LV sensing in CMOS respectively. A person skilled in the art will also understand that the LV control and sensing electronics can also be realised in bipolar or MOS circuits other than of the CMOS type. Each of the different regions are isolated from each other by insulating silicon dioxide layers (SiO2) 201 and 203. Layer 201 lies under all the active Si regions and is commonly referred to as the buried oxide (BOX) layer. The BOX layer in turn is formed on a common Si substrate layer 200. Layers 203 are defined lithographically and placed selectively for purposes of lateral isolation between the active Si regions.

Figure 2B:
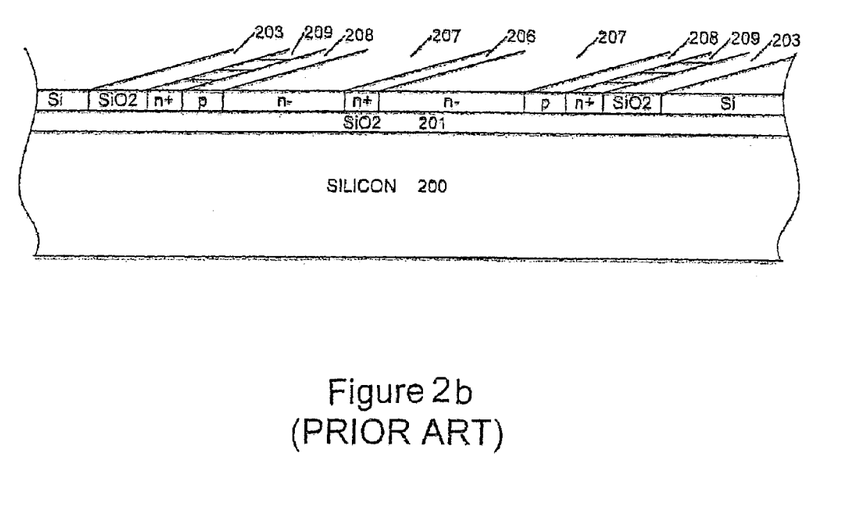

In FIG. 2b active Si layer for the HV device is shown in detail. The active layer semiconductor types (n, p) are those representative for an LDMOS devices. 206 forms the highly doped n type (n+) drain contact region of the LDMOS device. Region 207 forms the lowly doped n type (n−) region which acts as the drift region for supporting the high voltage in the off state through depletion. Region 208 forms the body region of the LDMOS transistor in which an n—inversion channel is formed on the surface to turn on the device. Region 209 is the source and body contact regions formed of alternating n+ and p+ semiconducting regions which are tied to the same potential.

Figure 3A:
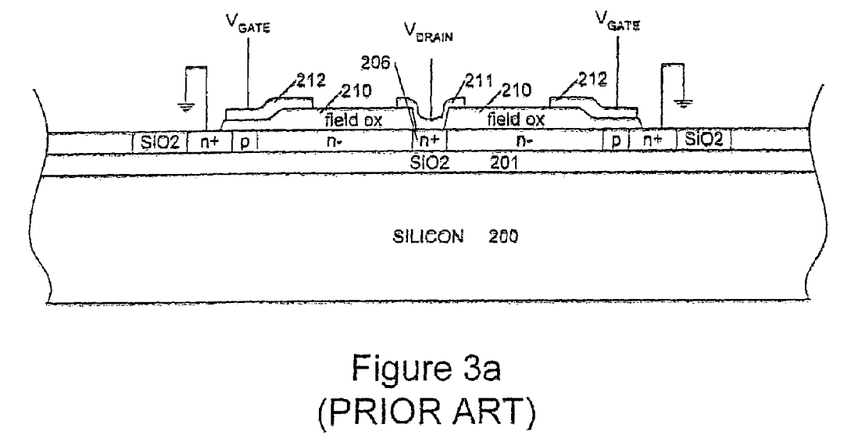
FIG. 3a shows an example of an LDMOS device in the prior art together with the source (earth), gate and drain contact regions

FIG. 3a shows an example of an LDMOS device in the prior art together with the source (earth), gate and drain contact regions. Region 210 forms the gate oxide and thicker deposited or thermally grown field oxide (field ox) region between the gate and the drain on the surface of the device. Layer 211 forms the drain contact, typically metal. Layer 212 is the gate electrode, typically made from highly doped polycrystalline Si.

Figure 3B:
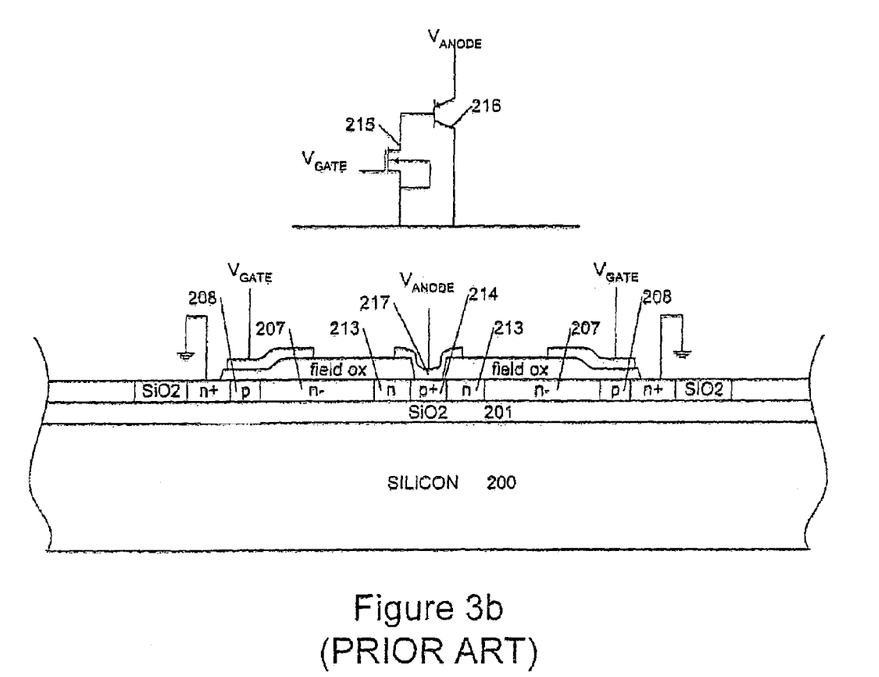
FIG. 3b shows an alternative semiconductor device type, the LIGBT.

FIG. 3b shows an alternative semiconductor device type, the LIGBT. Here the n+ region (region 206/211 in FIG. 3a) is replaced by a highly doped-p+ region 214 and an adjacent n region 213. The p+ region is contacted through metal layer 217. In the LIGBT the gate region and turn on through an inversion channel is identical to that of the LDMOS device. In the off state the depletion region grows in the n− drift legion util it reaches the more highly doped n region 213. Region 213 is not completely depleted, as if this occurred then punch through breakdown between the p-body region 208 and the p+ region 214 would take place and off state voltage blocking would be lost. In the on state the carrier concentration in the drift region is increased above that which it would be in the unipolar LDMOS device through minority carrier injection from the p+/n junction formed by regions 214/213. This results in a lower on state resistance after turn on for the LIGBT compared to the LDMOS device. The regions 208 (p), 207 (n−), 213 (n) and 214 (p+) effectively form a wide base p-n-p transistor in the on state with the base current being provided through the MOS channel. The equivalent circuit for the LIGBT is represented by transistors 216 (pnp bipolar) and 215 (n-channel MOS). Due to the bipolar injection nature of the LIGBT the high voltage terminal is referred to as the anode (or collector) and the low voltage terminal as cathode (or emitter). The control terminal is referred to as the gate as in the case of the LDMOS transistor.

Figure 4:
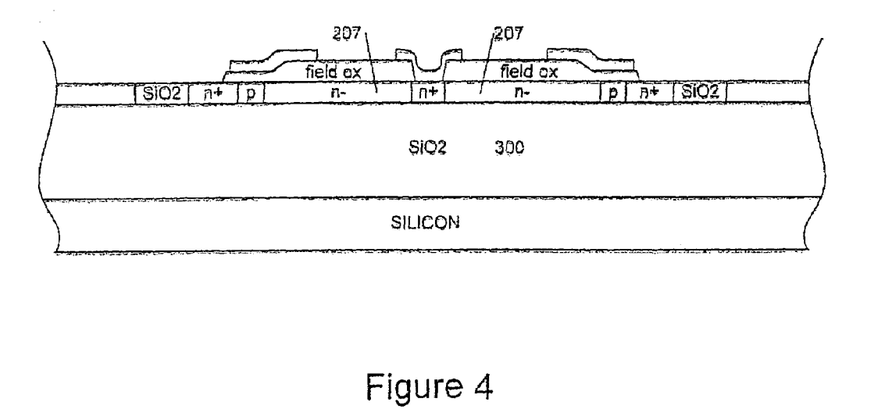
FIG. 4 shows a high voltage LDMOS transistor with a thick BOX layer.

To achieve good high voltage blocking performance in SOI it is necessary to spread the potential contours in the BOX layer to ensure that the field is kept below a certain magnitude as explained above in the context of describing the potential distribution in FIG. 1b. Tis requires that for a 600 V device that the BOX layer is made thick, typically a minimum of 4 um. FIG. 4 shows the high voltage DMOS transistor with a thick BOX layer 300. Making the layer 300 even thicker would allow for a better distribution of the potential contours in the lateral direction in the drift region 207 as well. Beyond a certain BOX thickness it is possible to achieve an almost idealised even distribution of electric potential (constant electric field) in the lateral direction within the drift region 207. Additionally for an LIGBT in SOI technology, FIG. 3b, it is necessary to ensure that the BOX thickness is adequate to prevent an inversion layer forming in the n− drift layer (207) and the n− buffer layer (213) to make a conductive path form the p− body layer (208) to the p+ anode (214) under high voltage blocking conditions. With the formation of such an inversion layer there would ensue the loss of the low current condition required during high voltage blocking in the off state. However, SOI wafers with thick BOX layers carry a number of technological disadvantages. These are related to built in stress between the thick oxide and Si substrate layers which leads to bowing of the wafers as the wafer diameter is increased beyond 100 mm. Additionally for power devices, the thick BOX layer 300 limits the transfer of thermally dissipated power in the HV device to the substrate as the thermal conductivity of silicon dioxide is approximately 100 times lower than that of Si.

Figure 5A:
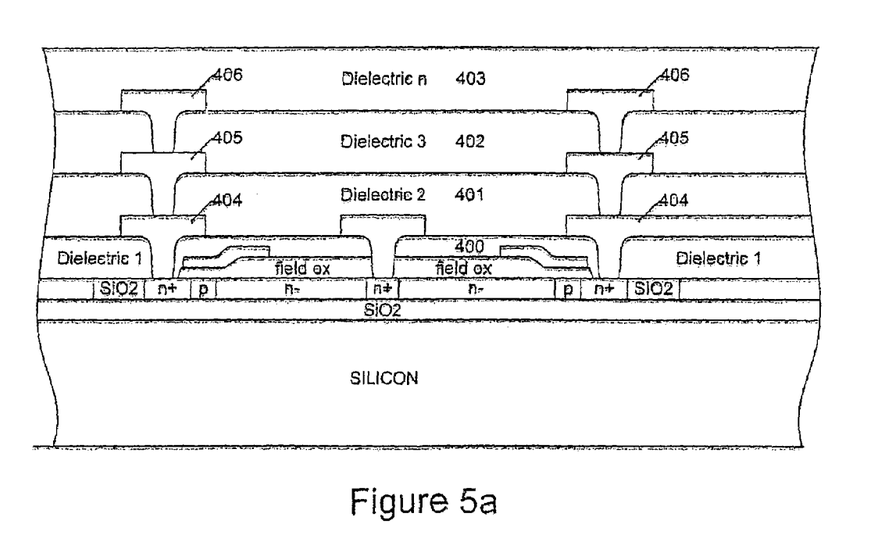
FIGS. 5a, 5b and 5c show LDMOS devices at first, second and third stages of fabrication according to the present invention.

Embodiments of the present invention overcome this problem by starting with an SOI wafer which has a standard BOX thickness (1 um or below) but carrying out further processing steps to achieve the effect of having a thick dielectric layer adjacent to voltage blocking region of the active Si in order to obtain a better potential distribution. This is achieved by using a multi-layer metal process in conjunction with the high voltage power device fabrication. After the formation of the power device a typical multilayer metal and interlayer dielectric isolation process is implemented as shown in FIG. 5a. Here 404, 405 and 406 are sequential layers of metal which are deposited to contact the selectively the source contact region. The first layer of metal 404 may also contact the drain contact region as shown. Before each metal layer deposition there is an isolating interlayer dielectric layer deposition (400, 401, 402 and a via hole opening process which allows contact between the metal regions in defined locations. After each interlayer dielectric deposition there is a planarising process to make the surface flat for the subsequent metal layer depositions. This is commonly done through chemical mechanical polishing (CMP). In the LDMOS type transistor shown in FIG. 5*a* (it could alternatively be an LIGBT) only one layer of metal is shown contacting the drain. As will be seen below, this contacting layer may be omitted completely. It is advantageous have it for field plate action adjacent to the drift region similar to the action of the gate electrode extension at the other end of the drift region.

Figure 5B:
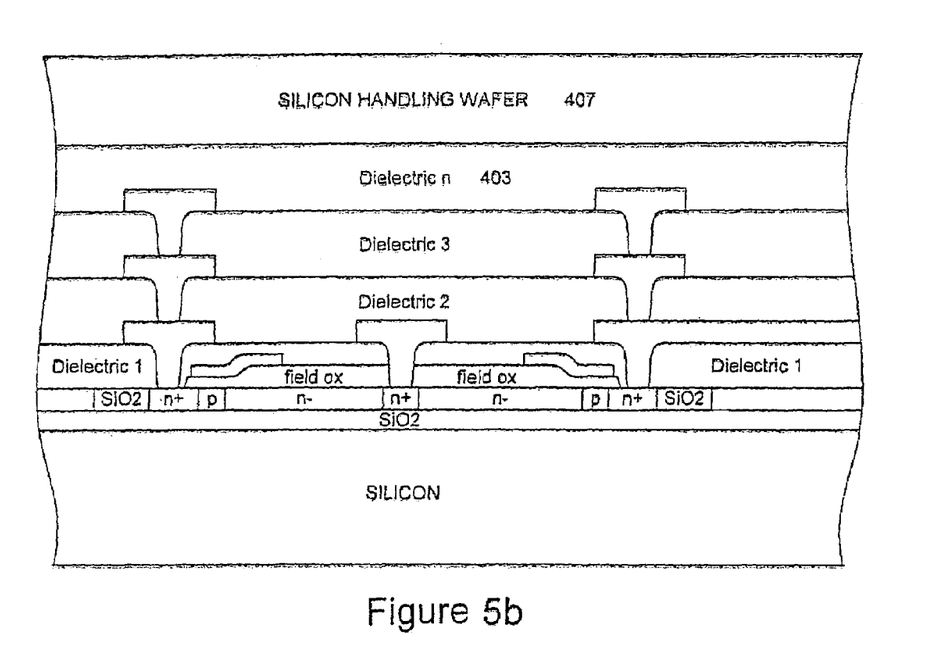

After the final layer of metal deposition and patterning, the final dielectric layer 403 is deposited and planarised. Following this a silicon handle wafer (407) is bonded to the top of the last dielectric n (layer 403), as shown in FIG. 5*b*, using one of the methods established for such bonding between Si and dielectric layers. This may include the formulation of an oxide layer on the surface of the Si handle wafer so that the bonding takes place between two dielectric surfaces.

Figure 5C:
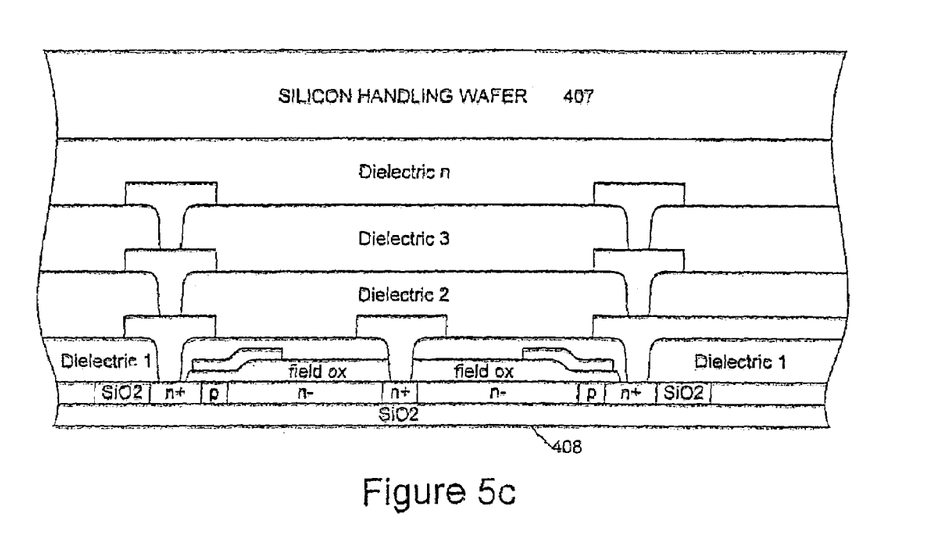

Following this the original substrate wafer of the starting SOI wafer is removed through either wet or dry chemical etching (FIG. 5*c*). The original BOX layer acts as an etch stop layer (409). The voltage blocking region in the active Si is now sandwiched by dielectric layers 1 to n on one side and the original BOX layer and air (also a dielectric) on the other. The figure shows 4 dielectric layers as an example but it will be appreciated by those skilled in the art that other values for 'n' are also possible. Compared with the standard SOI example the high voltage device is now upside down with the contact regions facing the substrate, which is now the bonded Si handle wafer. Dielectric layers 1 to n act as the thick dielectric insulating layers in which the potential lines are distributed to achieve and idealised distribution. The metallisation on the source reaches all the way to last dielectric layer. This means that the separation of the source from the substrate is only that of the last dielectric layer. This enhances thermal conduction to the substrate through the source metal fins and mitigates the negative effect of a uniformly thick dielectric layer for thermal performance of the high voltage power device.

Figure 6A:
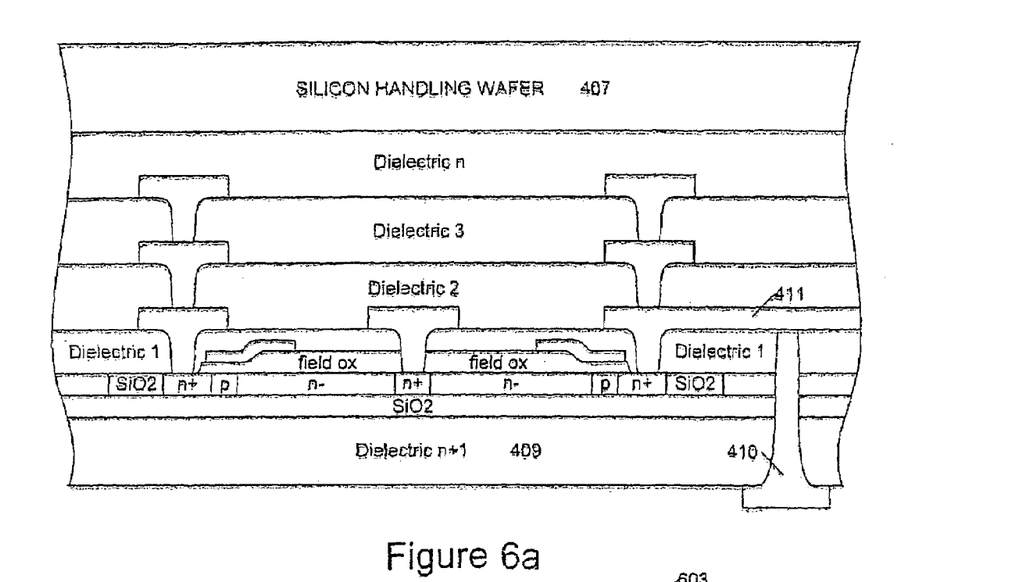

In FIG. 6*a* an additional dielectric layer n+1 (409) is shown on the original BOX layer. This can be formed after etching of the substrate through well-established processes such as plasma enhanced chemical vapour deposition. The purpose of the layer is to provide enhanced electrical and mechanical robustness to the relatively thin BOX layer which is now exposed to air. Silicon nitride would a typical material for layer 409. Alternatively boro-silicate lass or low temperature oxide (LTO) can be used.

Figure 6B:
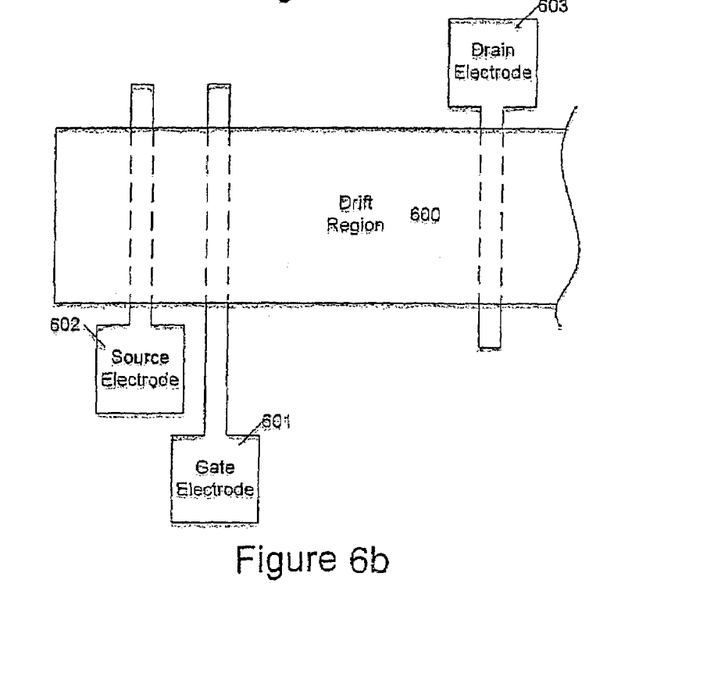

In this embodiment all the contacts and the interconnections in the control circuits, sensing circuits and between them and the power device are upside down and facing the substrate. All the interconnections are standard and are designed as they would be in a standard integrated circuit. This then leaves the issue of making contact to the electrical circuits and the high voltage device externally. As shown in FIG. 6*a*, this is achieved by turning over the structure so that the Si handle wafer forms the substrate and lithographically patterning and etching through from the original underside of the BOX (now top side), through dielectric layer 1 to make contact with the metal contact pads (411) defined on the original-top side (now underside facing the bonded Si substrate 407). Such a contact to the source region of the IV device through metal contact 410 is shown in cross section in FIG. 6*a*. FIG. 6*b* shows the plan view of such contact regions which are placed outside the active Si areas on the perimeter in what is termed commonly as the contact pad regions. Therefore contact is achieved by etching through the BOX layer and dielectric layer 1 to the contact pad regions defined on the under side.

Figure 7:
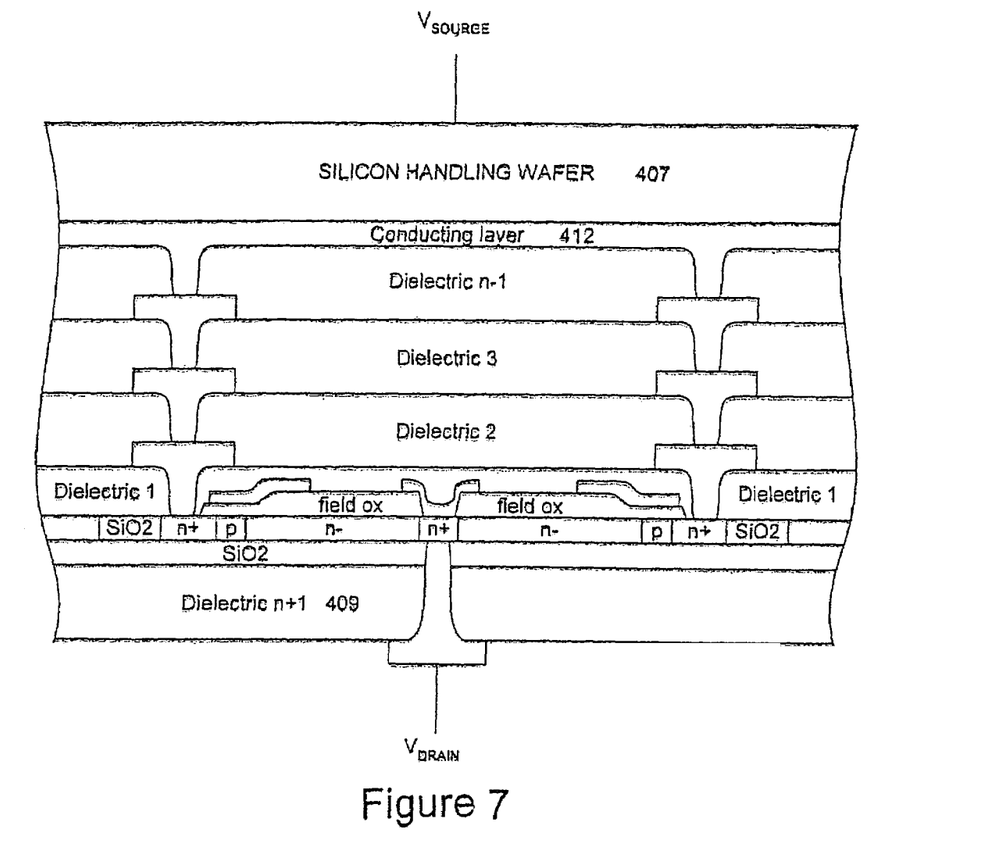
FIG. 7 shows an alternative LDMOS device according to the present invention.

An alternative embodiment is shown in FIG. 7. Here the final dielectric layer n (403 on previous figures) is replaced with a highly doped aluminised Si or poly-Si layer (412). The bonding of the handle wafer (407) (without any dielectric layer on the bonding surface) is then made to this layer which is conducting, In this way it is possible to have a conducting path through the metal fin stack on the source to the Si handle wafer (the new substrate). In such an embodiment the source contact would be the Si handle wafer which acts as the substrate and would be on the opposite surface to the drain and gate contacts which are formed through etching from the new top side to the contact pads defined on the original top side. Having the main current flow through the device from the top side to the bottom substrate makes this embodiment a vertical type power device. It will be understood by those skilled in the art that this embodiment has metal layers underlying the final conducting aluminised Si or poly-Si layer which are temperature compatible with process used for formation of the conducting layer.

No doubt many other effective alternatives will occur to the skilled person. It will be understood that the invention is not limited to the described embodiments and encompass modifications apparent to those skilled in the art lying within the spirit and scope of the claims appended hereto.

The invention claimed is:

1. A method of fabricating a power semiconductor, the method comprising:
    forming a semiconductor device on a semiconductor-on-insulator (SOI) substrate, said SOI substrate comprising a first substrate, an intermediate insulating layer and a semiconducting layer;
    forming one or more at least partially insulating layers comprising metallization layers over said semiconductor device;
    attaching a second substrate on top of said one or more at least partially insulating layers;
    removing said first substrate;
    forming an at least partially insulating layer under said intermediate insulating layer; and
    etching through said at least partially insulating layer and said intermediate insulating layer to make connections to said device.

2. A method as claimed in claim 1 wherein said one or more at least partially insulating layers have a thickness of greater than 10 μm.

3. A method as claimed in claim 1 wherein said attaching of said second substrate comprises wafer bonding.

4. A method as claimed in claim 1 wherein said one or more at least partially insulating layers have a thickness of greater than 15 μm.

5. A method of fabricating a power semiconductor having a drift region such that said drift region is spaced away from a substrate of said power semiconductor by at least 5 μm, the method comprising:
    forming a power semiconductor device on a semiconductor-on-insulator (SOI) substrate, said SOI substrate comprising a first substrate, an intermediate insulating layer and a semiconducting layer;

forming a plurality of at least partially insulating layers over said power semiconductor device, said plurality of at least partially insulating layers having a thickness of at least 5 µm;

wafer bonding a second substrate on top of said plurality of at least partially insulating layers;

removing said first substrate such that said power semiconductor device is supported by said second substrate; and forming a heat sink for said device by forming metallization within said plurality of at least partially insulating layers, said metallization extending from a contact of said power semiconductor device through multiple layers of said plurality of at least partially insulating layers towards said second substrate to enhance thermal conduction from said power semiconductor device to said second substrate.

6. A method as claimed in claim 5 wherein said forming of said heat sink comprises forming said metallization to extend into a said at least partially insulating layer adjacent said second substrate.

7. A method as claimed in claim 6 further comprising electrically insulating said power semiconductor device from said second substrate and said metallization using said at least partially insulating layer adjacent said second substrate, and forming connections to said power semiconductor device through said intermediate insulating layer, said intermediate insulating layer being on an opposite side of said power semiconductor device to said metallization.

8. A method as claimed in claim 6 wherein said forming of said heat sink comprises forming said metallization to extend to form an electrical contract with said second substrate, the method further comprising using said second substrate for a first external electrical contact to said power semiconductor and forming at least one further external connection for said power semiconductor device through said intermediate insulating layer, said intermediate insulating layer being on an opposite side of said power semiconductor device to said metallization.

9. A method as claimed in claim 5 wherein said forming of said heat sink comprises forming said metallization to extend from a plurality of contact regions of said power semiconductor device.

10. A method as claimed in claim 5 wherein said forming of said heat sink comprises forming fins using said metallization.

11. A method as claimed in claim 5 wherein said plurality of at least partially insulating layers have a thickness of at least 10 µm.

12. A method as claimed in claim 5 wherein said plurality of at least partially insulating layers have a thickness of at least 15 µm.

* * * * *